(12) United States Patent
Afentakis et al.

(10) Patent No.: US 7,659,586 B2
(45) Date of Patent: Feb. 9, 2010

(54) INVERTER WITH FOUR-TRANSISTOR SCHMITT TRIGGER

(75) Inventors: Themistokles Afentakis, Vancouver, WA (US); Apostolos T. Voutsas, Portland, OR (US); Paul J. Schuele, Washougal, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 15 days.

(21) Appl. No.: 12/142,602

(22) Filed: Jun. 19, 2008

(65) Prior Publication Data

US 2008/0272816 A1 Nov. 6, 2008

Related U.S. Application Data

(60) Division of application No. 11/408,220, filed on Apr. 20, 2006, now Pat. No. 7,407,843, which is a continuation-in-part of application No. 10/862,761, filed on Jun. 7, 2004, now Pat. No. 7,235,437, which is a continuation-in-part of application No. 10/831,424, filed on Apr. 23, 2004, now Pat. No. 6,995,053, application No. 12/142,602, which is a continuation-in-part of application No. 11/387,626, filed on Mar. 23, 2006, now abandoned, and a continuation-in-part of application No. 11/184,699, filed on Jul. 18, 2005, now Pat. No. 7,532,187, and a continuation-in-part of application No. 10/953,913, filed on Sep. 28, 2004, now abandoned.

(51) Int. Cl.
*H01L 29/76* (2006.01)
*H01L 21/00* (2006.01)
(52) U.S. Cl. .................. 257/365; 438/151
(58) Field of Classification Search .............. 257/270, 257/365, E29.183, 212; 363/56.01; 438/151–154
See application file for complete search history.

(56) References Cited

U.S. PATENT DOCUMENTS

| 6,462,723 | B1 * | 10/2002 | Yamazaki et al. | 345/82 |
| 6,730,550 | B1 * | 5/2004 | Yamazaki et al. | 438/166 |
| 7,407,843 | B2 * | 8/2008 | Afentakis et al. | 438/151 |

* cited by examiner

*Primary Examiner*—Calvin Lee
(74) *Attorney, Agent, or Firm*—Law Office of Gerald Maliszewski; Gerald Maliszewski

(57) ABSTRACT

A four-transistor Schmitt trigger inverter is provided. The Schmitt trigger inverter is made from an n-channel MOS (NMOS) dual-gate thin-film transistor (DG-TFT) and a p-channel MOS (PMOS) DG-TFT, both DG-TFTs having a top gate, a back gate, and source/drain regions. A (conventional) NMOS TFT has a gate connected to an NMOS DG-TFT first S/D region and a PMOS DG-TFT first S/D region. The NMOS TFT also has a first S/D region connected to the NMOS DG-TFT back gate and the PMOS DG-TFT back gate. A (conventional) PMOS TFT has a gate connected to the NMOS TFT gate, and a first S/D region connected to the NMOS TFT first S/D region.

4 Claims, 7 Drawing Sheets

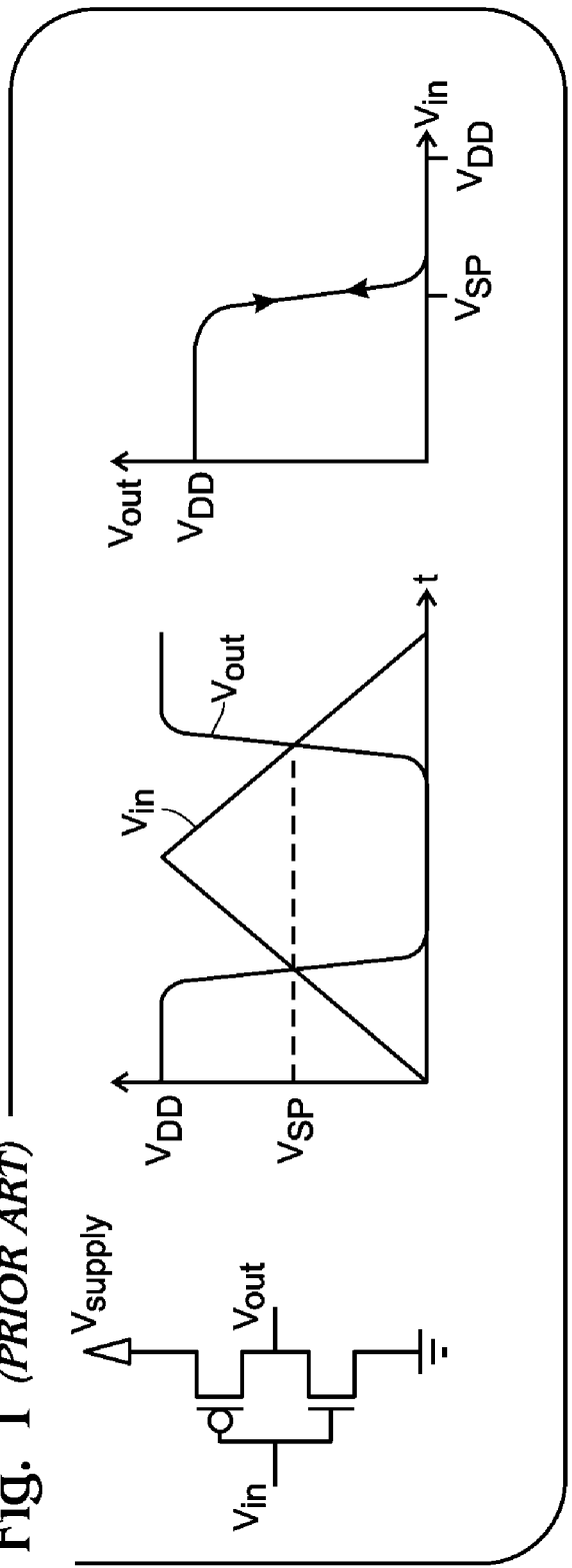
Fig. 1 *(PRIOR ART)*
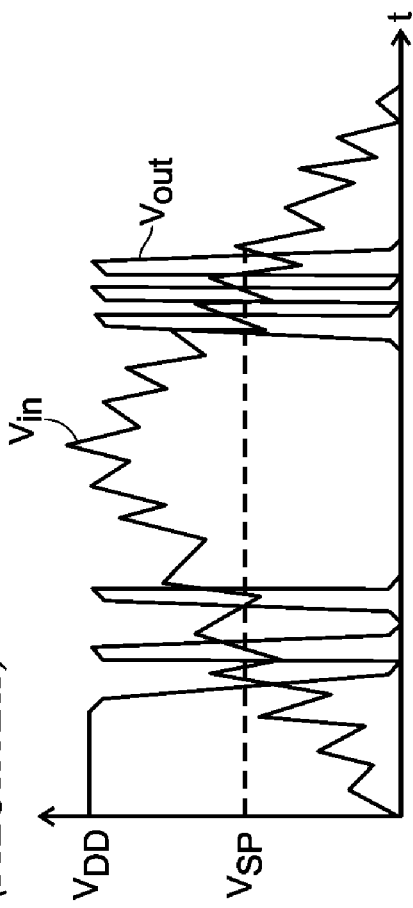
Fig. 2 *(PRIOR ART)*

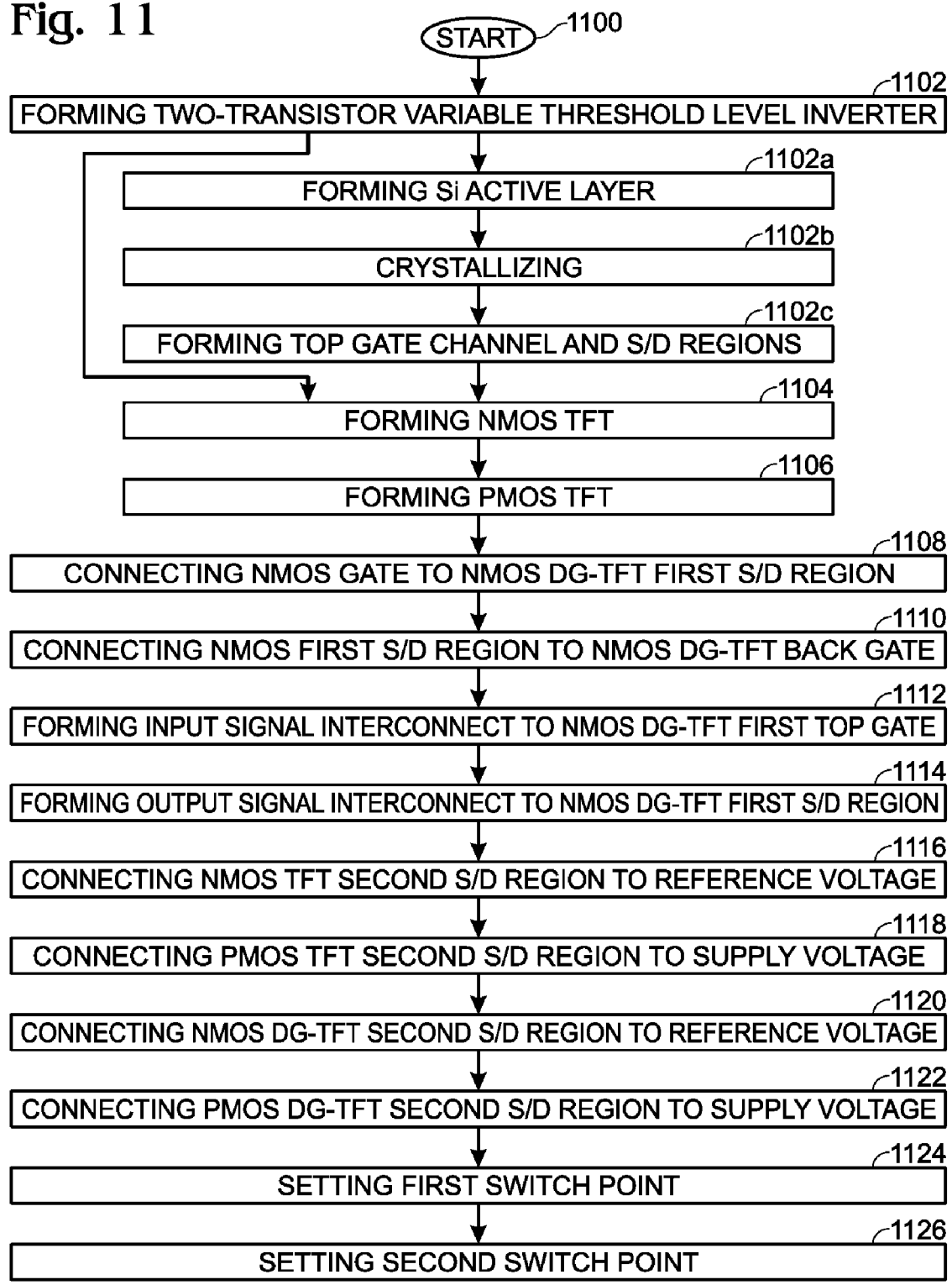

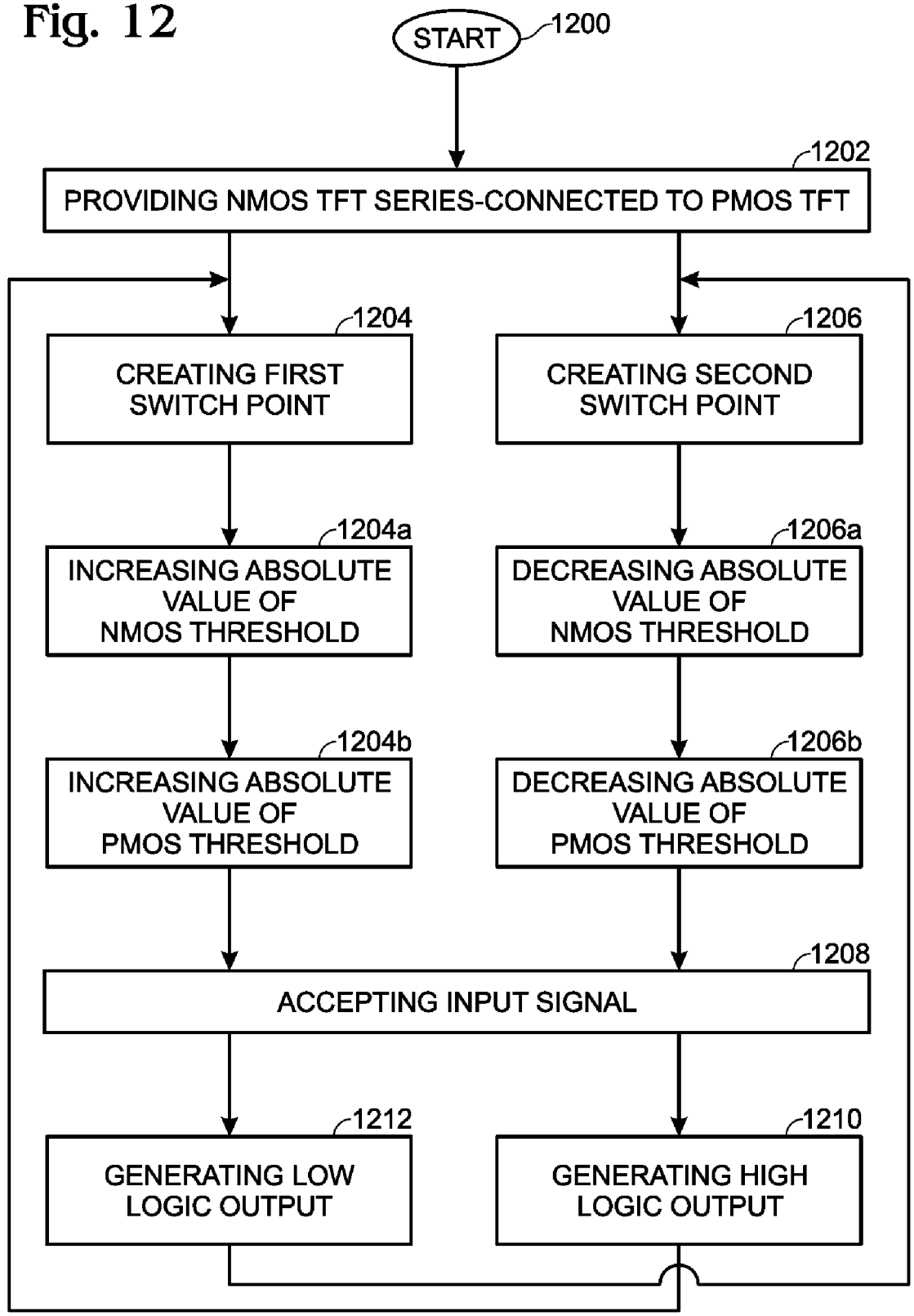

INVERTER WITH FOUR-TRANSISTOR SCHMITT TRIGGER

RELATED APPLICATIONS

This application is a Divisional of a patent application entitled, FOUR-TRANSISTOR SCHMITT TRIGGER INVERTER, Afentakis et al., Ser. No. 11/408,220, filed Apr. 20, 2006, now U.S. Pat. No. 7,407,843;

which is a continuation-in-part of a patent application entitled, MULTI-PLANAR LAYOUT VERTICAL THIN-FILM TRANSISTOR INVERTER, Schuele et al., Ser. No. 10/862,761, filed Jun. 7, 2004, now U.S. Pat. No. 7,235,437, which is a continuation-in-part of an issued patent application Ser. No. 10/831,424 entitled, VERTICAL THIN FILM TRANSISTOR, invented by Schuele et al., U.S. Pat. No. 6,995,053, filed Apr. 23, 2004.

This application is a continuation-in-part of a patent application entitled, DUAL-GATE THIN-FILM TRANSISTOR, invented by Schuele et al., Ser. No. 10/953,913, filed Sep. 28, 2004, now abandoned.

This application is a continuation-in-part of a patent application entitled, DUAL-GATE TRANSISTOR DISPLAY, invented by Afentakis et al., Ser. No. 11/184,699, filed Jul. 18, 2005, now U.S. Pat No. 7,532,187.

This application is a continuation-in-part of a patent application entitled, TWO-TRANSISTOR TRI-STATE INVERTER, invented by Afentakis et al., Ser. No. 11/387,626, filed Mar. 23, 2006, now abandoned. All the above-mentioned applications are incorporated herein by reference.

BACKGROUND OF THE INVENTION

1. Field of the Invention

This invention generally relates to integrated circuit (IC) fabrication and, more particularly, to a Schmitt trigger inverter circuit, made with only four transistors, and a corresponding fabrication process.

2. Description of the Related Art

FIG. 1 is a schematic diagram of a CMOS inverter, and diagrams of an ideal output waveform and input-output transfer characteristics (prior art). Problems can arise when digital signals are interfaced with circuitry, especially if the digital input signals are corrupted by noise. The input stages of most digital circuits are designed adhering to pre-specified input amplitude levels for logic 0 (low) and logic 1 (high). For complementary metal-oxide-semiconductor (CMOS) implementations, these levels, designated $V_{IL}$ and $V_{IH}$, are set to 1.3V and 3.7V, respectively, using a 5V supply voltage referenced to ground. For transistor-to-transistor logic (TTL), $V_{IL}$ and $V_{IH}$ are at 0.8V and 2.0V, respectively, using a 5V supply voltage referenced to ground. Input signals below $V_{IL}$ are interpreted as logic 0, and signals above $V_{IH}$ as logic 1. Because of these levels, there exists a single input voltage level, designated as the "switching point" voltage $V_{SP}$ (also referred to in the literature as threshold voltage, but not to be confused with the threshold voltage of MOSFET transistors), which triggers a change in the output state of the digital circuit. With a 5V-supply, the CMOS $V_{SP}$=2.5V, while for TTL $V_{SP}$=1.5V. Ideally, $V_{SP}=V_{DD}/2$ for CMOS.

FIG. 2 is a diagram depicting the response of the CMOS inverter of FIG. 1 with a noise-corrupted input signal. $V_{out}$ switches states erroneously due to noise-induced $V_{in}$ excursion around $V_{SP}$. Variations of the input level around $V_{SP}$ due to noise, which are not present when using an ideal input signal, cause interfacing digital circuitry, such as an input buffer, to change output states multiple times before stabilizing in the correct state. This undesirable situation propagates noise artifacts through the interface.

FIG. 3 is a schematic diagram of a conventional Schmitt trigger inverter circuit (prior art). One remedy for the noise problem depicted in FIG. 2 is to use digital circuits exhibiting an intentional amount of hysteresis in their DC transfer characteristics, such as the Schmitt trigger.

FIG. 4 depicts the response of a hysteresis CMOS inverter, with the noisy input signal of FIG. 2, and hysteresis DC transfer characteristics (prior art). The output switches states only when $V_{in}>V_{SPH}$ or $V_{in}<V_{SPL}$. Thus, a higher-than-midpoint voltage input is required to generate a logic low output signal, while a lower-than-midpoint voltage input is need to generate a logic high output signal.

It would be advantageous if the size of a Schmitt trigger inverter circuit could be reduced by using transistors with greater functionality.

It would be advantageous if a Schmitt trigger inverter circuit could be made with transistors having built-in control functionality, to reduce the total number of transistors needed to build the circuit.

SUMMARY OF THE INVENTION

The present invention is a novel Schmitt trigger inverter circuit, employing dual-gate (DG) thin-film transistors (TFTs). The invention's architecture requires only 4 transistors and no other elements, instead of the 6 transistors conventionally required (see FIG. 3). Consequently, more compact circuit implementations, with better area utilization are possible. Also, due to a lower transistor count, lower power dissipation can be obtained than is possible with conventional Schmitt trigger designs. Since many circuits incorporate a large numbers of Schmitt triggers, the benefits of this approach are substantial.

Accordingly, a four-transistor Schmitt trigger inverter is provided. The Schmitt trigger inverter is made from an n-channel MOS (NMOS) dual-gate thin-film transistor (DG-TFT) and a p-channel MOS (PMOS) DG-TFT, both DG-TFTs having a top gate, a back gate, and source/drain regions. A (conventional) NMOS TFT has a gate connected to an NMOS DG-TFT first S/D region and a PMOS DG-TFT first S/D region. The NMOS TFT also has a first S/D region connected to the NMOS DG-TFT back gate and the PMOS DG-TFT back gate. A (conventional) PMOS TFT has a gate connected to the NMOS TFT gate, and a first S/D region connected to the NMOS TFT first S/D region.

The NMOS DG-TFT top gate is connected to the input signal (Vin) and the first S/D region supplies an output signal (Vout). The PMOS DG-TFT top gate is also connected to the input signal. The NMOS DG-TFT has a second S/D region is connected to a reference voltage (e.g., ground) and the PMOS DG-TFT has a second S/D region connected to a supply voltage (e.g., 5 volts) having a higher voltage than the reference voltage. Likewise, the NMOS TFT second S/D region is connected to the reference voltage, and the PMOS TFT second S/D region is connected to the supply voltage.

As explained in more detail below, the back gate of each DG-TFT exerts control over the corresponding channel region. In this manner, a control signal to the back gates can be used to turn the change to the circuit switching points.

Additional details of the above-described Schmitt trigger inverter, a corresponding fabrication process, and a method for introducing hysteresis into the operation of a CMOS inverter are presented below.

BRIEF DESCRIPTION OF THE DRAWINGS

FIG. 1 is a schematic diagram of a CMOS inverter, and diagrams of an ideal output waveform and input-output transfer characteristics (prior art).

FIG. 2 is a diagram depicting the response of the CMOS inverter of FIG. 1 with a noise-corrupted input signal.

FIG. 11 is a flowchart illustrating a method for forming a four-transistor Schmitt trigger inverter.

FIG. 12 is a flowchart illustrating a method for introducing hysteresis into the operation of a CMOS inverter.

DETAILED DESCRIPTION

Figure 3:
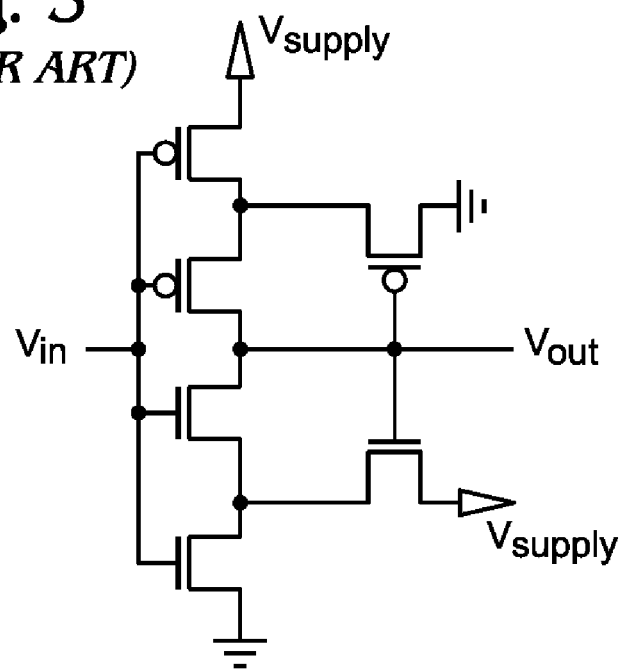
FIG. 3 is a schematic diagram of a conventional Schmitt trigger inverter circuit (prior art).
Figure 5:
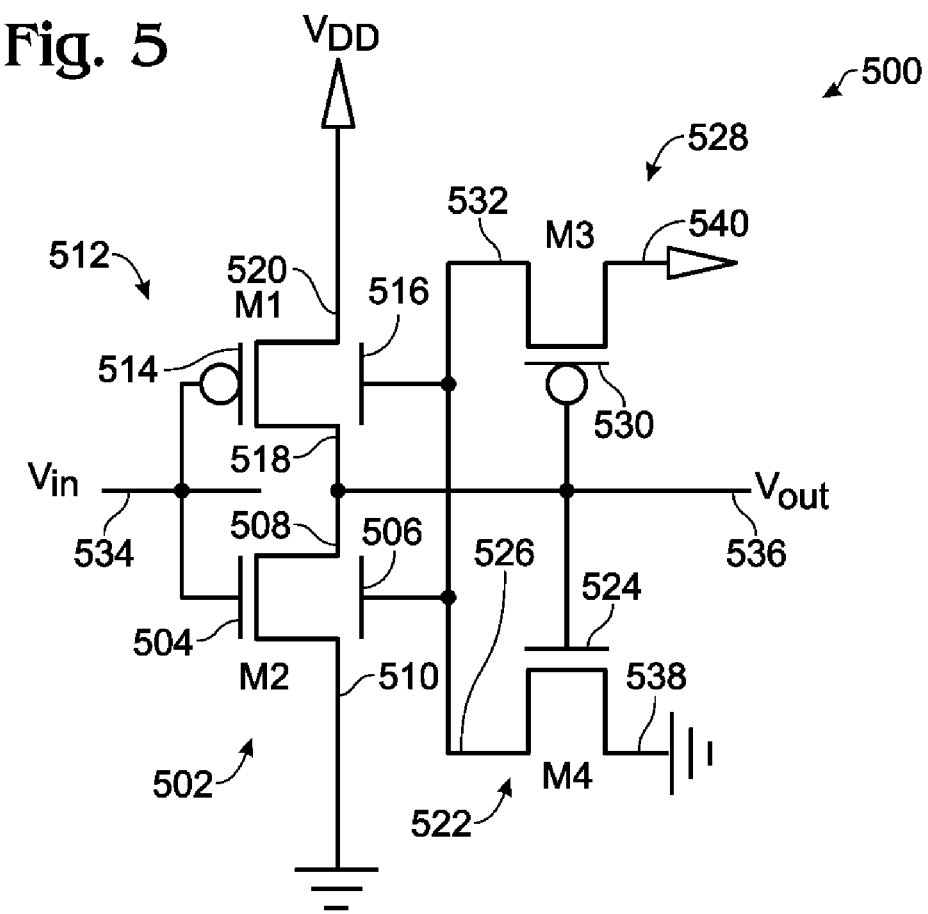
FIG. 5 is a schematic diagram of a four-transistor Schmitt trigger inverter.
Figure 4:
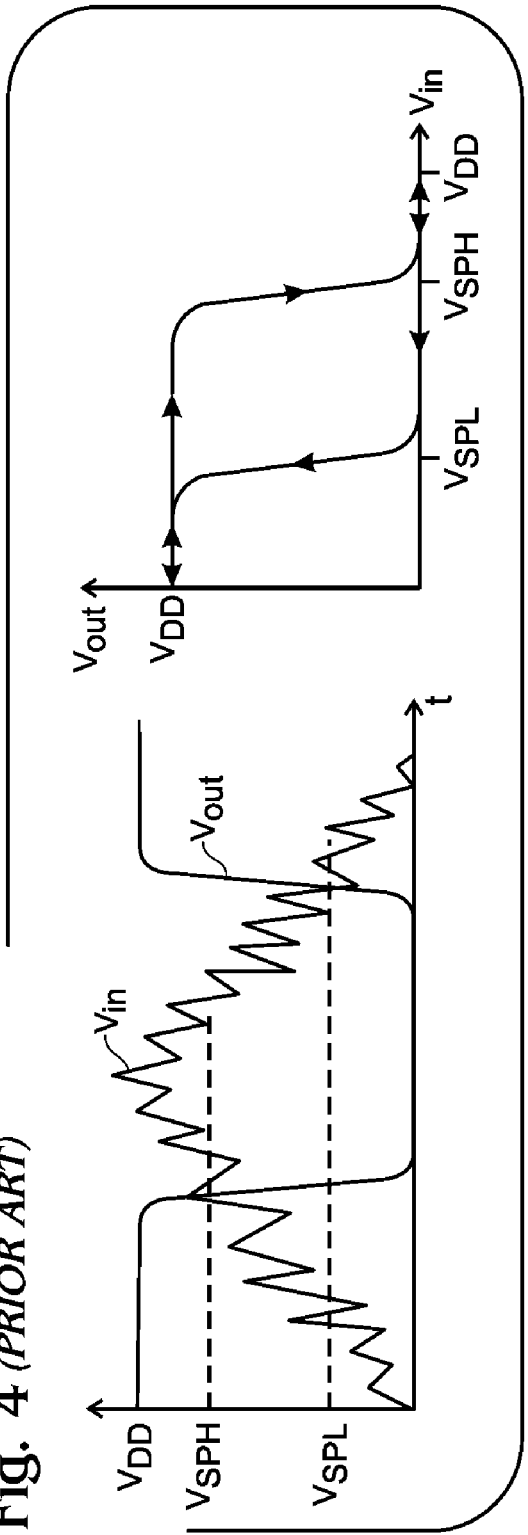
FIG. 4 depicts the response of a hysteresis CMOS inverter, with the noisy input signal of FIG. 2, and hysteresis DC transfer characteristics (prior art).

FIG. 5 is a schematic diagram of a four-transistor Schmitt trigger inverter. The Schmitt trigger inverter 500 comprises a NMOS dual-gate thin-film transistor (DG-TFT) 502 (M2) having a top gate 504, a back gate 506, and source/drain regions 508 and 510. A PMOS DG-TFT 512 (M1) has a top gate 514, a back gate 516, and S/D regions 518 and 520. A NMOS TFT 522 (M4) has a gate 524 connected to an NMOS DG-TFT first S/D region 508 and a PMOS DG-TFT first S/D region 518. The NMOS TFT 522 has a first S/D region 526 connected to the NMOS DG-TFT back gate 506 and the PMOS DG-TFT back gate 516. A PMOS TFT 528 (M3) has a gate 530 connected to the NMOS TFT gate 524, and a first S/D region 532 connected to the NMOS TFT first S/D region 526.

The NMOS DG-TFT top gate 504 is connected to the input signal (Vin) on line 534 and the first S/D region 508 supplies an output signal (Vout) on line 536. The PMOS DG-TFT top gate 514 is also connected to the input signal on line 534. The NMOS DG-TFT 502 has a second S/D region 510 that is connected to a reference voltage, such as ground. The PMOS DG-TFT 512 has a second S/D region 520 connected to a supply voltage (Vdd), such as 5 volts, having a higher voltage than the reference voltage. An NMOS TFT second S/D region 538 is connected to the reference voltage, and a PMOS TFT second S/D region 540 is connected to the supply voltage.

Figure 6:
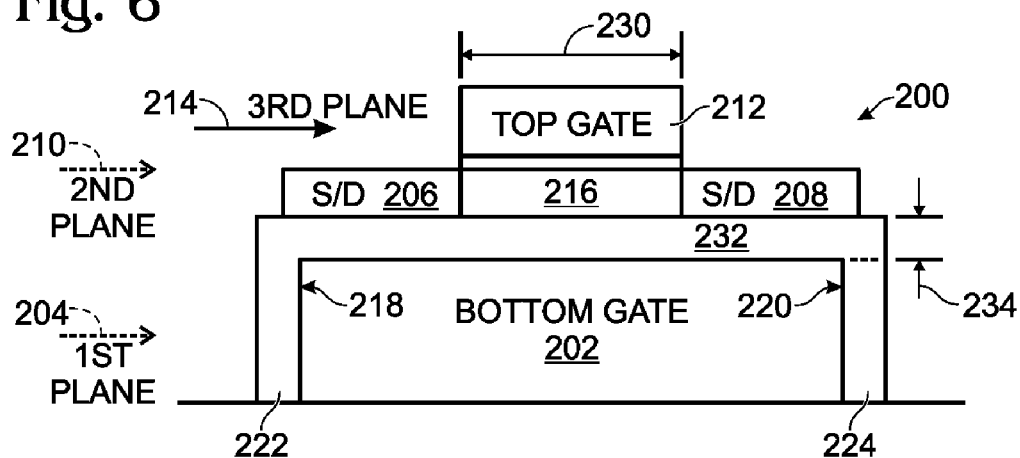
FIG. 6 is a partial cross-sectional view of an exemplary dual-gate thin-film transistor (DG-TFT).

FIG. 6 is a partial cross-sectional view of an exemplary dual-gate thin-film transistor (DG-TFT). The DG-TFT 200 has the DG-TFT bottom gate 202 aligned in a first horizontal plane 204. The first S/D region 206 and second S/D region 208 are aligned in a second horizontal plane 210, overlying the first plane 204. The top gate 212 is aligned in a third horizontal plane 214, overlying the second plane 210. A channel region 216 is formed in the second horizontal plane 210, intervening between the first S/D region 206 and the second S/D region 208. The bottom gate 202 has vertical sides 218 and 220, and insulating sidewalls 222 and 224 are formed over the bottom gate vertical sides 218 and 220, respectively. The first S/D region 206 and second S/D region 208 overlie the bottom gate 202, between the bottom gate vertical sides 218 and 220.

It should be noted that FIG. 6 depicts one particular embodiment of a DG-TFT. Other DG-TFT devices, both conventional and proprietary (not shown) may also be used to enable the Schmitt trigger inverter circuit described herein.

In one aspect, the NMOS and PMOS DG-TFTs each have a channel 216 with a channel width 230 underlying the top gate 212. Further, there is a dielectric layer 232 having a thickness 234 between the channel 216 and the bottom gate 202. Then, the Schmitt trigger inverter of FIG. 5 has a circuit first switch point responsive to the DG-TFT channel width 230, and a circuit second switch point, lower than the first switch point, responsive to the dielectric thickness 234 between the channel 216 and the bottom gate 202.

Figure 7:
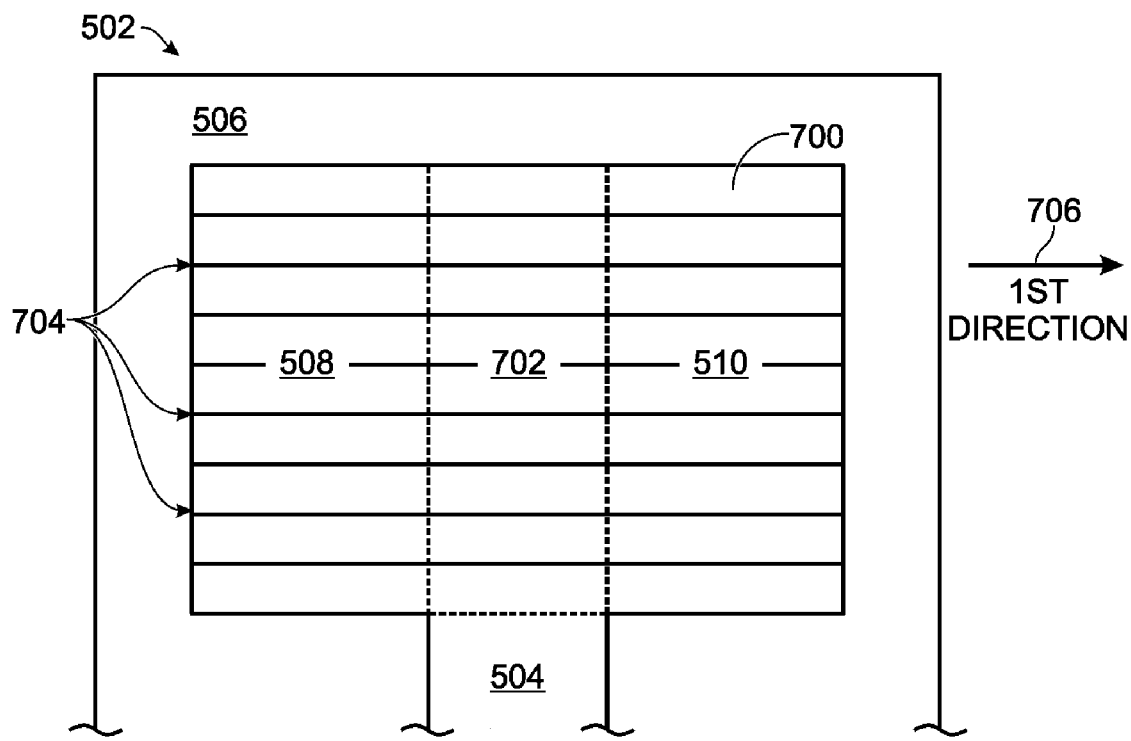
FIG. 7 is a plan view of the NMOS DG-TFT of FIG. 5.

FIG. 7 is a plan view of the NMOS DG-TFT of FIG. 5. The NMOS DG-TFT 502 includes a crystallized Si active layer 700 interposed between the top gate 504 and the back gate 506. The top gate channel 702 and S/D regions 508 and 510 are formed in the crystallized Si active layer 700. In one aspect, the crystallized Si active layer 700 is formed in a single-crystal-like structure having grain boundaries 704 in a first direction 706, parallel to the flow of carriers between the S/D regions 508/510. Although not shown, the PMOS DG-TFT of FIG. 5 may also include a crystallized active Si layer.

Functional Description

The present invention Schmitt trigger inverter utilizes a DG-TFT to minimize the number of transistors required to implement the same functions as a conventional Schmitt trigger inverter. Specifically, the invention makes use of the fact that the threshold voltage of a DG-TFT can be modulated by the applied bias at the back gate, which is also referred to as a bottom or secondary gate terminal. The invention switches the threshold voltage of PMOS and NMOS DG-TFTs between two discreet levels, in response to a digital signal at the back gates of the devices. For simplicity, the two back-gate levels of the DG-TFTs may be assumed to be $V_{DD}$ and ground. However, the DG-TFTs may be fabricated to operate with other bias voltages.

Figure 8:
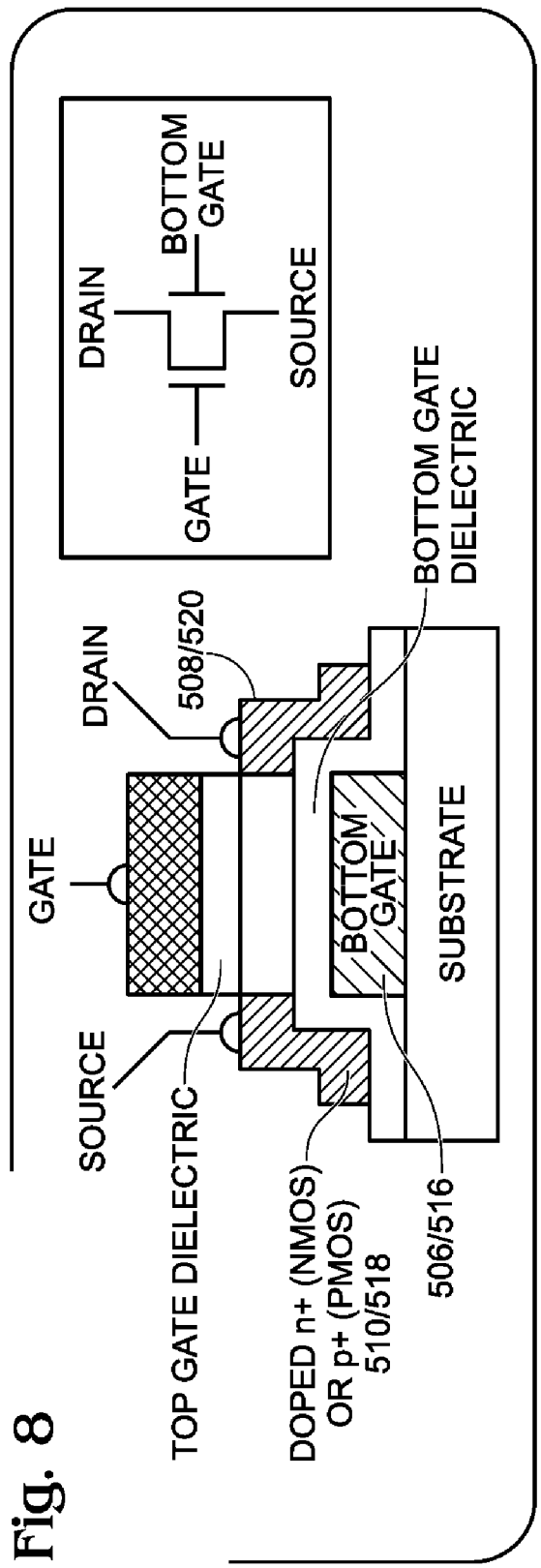
FIG. 8 is a partial cross-sectional and schematic view, depicting the DG-TFT of FIG. 6 in greater detail.

FIG. 8 is a partial cross-sectional and schematic view, depicting the DG-TFT of FIG. 6 in greater detail. When a zero bias is applied at the back gate, the transistor operates as a conventional TFT, with a threshold voltage $V_{TH0}$. A positive bias ($V_{BG}$>0) at the back gate pushes the channel into depletion earlier, thus a lower voltage at the top gate is required to invert it, causing a lower threshold voltage $V_{TH}$<$V_{TH0}$.

Figure 9:
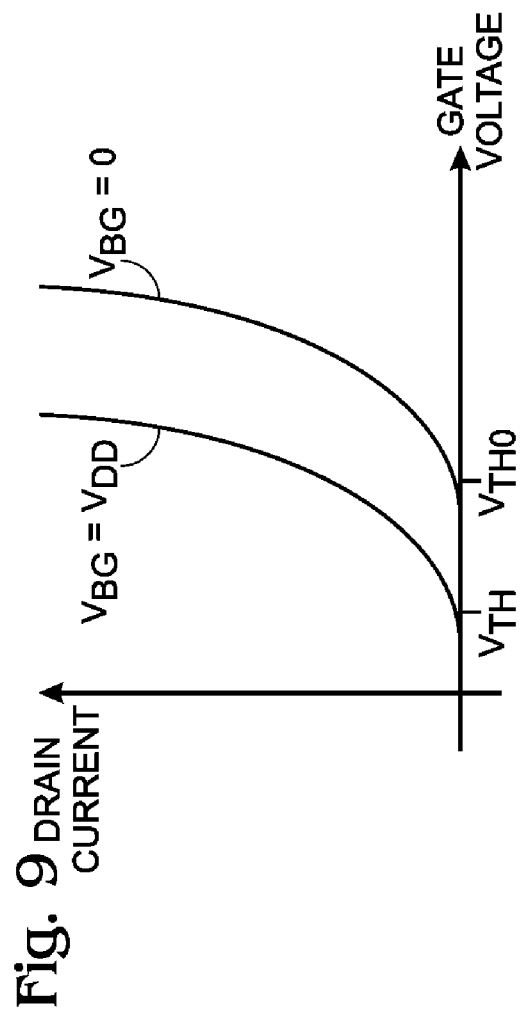
FIG. 9 is a diagram depicting the operation of a NMOS DG-TFT.

FIG. 9 is a diagram depicting the operation of a NMOS DG-TFT. The horizontal axis is top gate voltage, and $V_{BG}$ is the bottom gate voltage. With a PMOS DG-TFT, having p+ doped drain and source regions, the operation is analogous. A positive bias at the back gate opposes the onset of depletion by the top gate, increasing the threshold voltage of the device (i.e. making it more negative). The $V_T$ shift $V_{TH0}$-$V_{TH}$ can be adjusted by the bottom gate dielectric thickness, where increasing the bottom gate dielectric thickness decreases the $V_T$ sensitivity to back-gate bias.

Referring again to FIG. 5, devices M1 (512) and M2 (502) are DG-TFTs, and they share the same voltage at their back-gate terminals ($V_{BG}$). $V_{BG}$ is generated by the inverter formed from M3 (528) and M4 (522). Essentially, the hysteresis function is a result of the negative shunt feedback of the circuit, created by M3 (528) and M4 (522). The operation of the circuit shown in FIG. 5 can be explained as follows.

When $V_{BG}=0V$ (i.e., $V_{out}=V_{DD}$ and $V_{in}=0$), no bias is applied to the back gates of the M1-M2 inverter, and its operation is identical to that of a conventional CMOS inverter (see FIG. 1). The switching point voltage of the inverter is given by:

$$V_{SP} = \frac{\sqrt{\beta_n}\, V_{TH0,N} + \sqrt{\beta_p}\, (V_{DD} - V_{TH0,P})}{\sqrt{\beta_p} + \sqrt{\beta_n}} \quad (1)$$

where $V_{TH0,N}$ and $V_{TH0,P}$ are the zero back gate bias threshold voltages of M2 and M1. The transconductance coefficients are:

$$\beta_n = \mu_n C_{ox} W_n / L; \text{ and,} \quad (2)$$

$$\beta_p = \mu_p C_{ox} W_p / L.$$

Unlike the conventional CMOS inverter, in which the device channel widths $W_n$ and $W_p$ are selected for $V_{SP}=V_{DD}/2$, in the present invention design, the widths of M1 and M2 are selected so that $V_{SP}=V_{SPH}>V_{DD}/2$. For example, $V_{SP\,can\,be\,set\,at}$ $\frac{2}{3}V_{DD}$. In this case, the widths of M1 and M2 should satisfy:

$$\frac{W_{M2}}{W_{M1}} = \frac{\mu_p}{\mu_n}\left(\frac{V_{DD} - 3V_{TH0,P}}{2V_{DD} - 3V_{TH0,N}}\right)^2 \quad (3)$$

Figure 10:
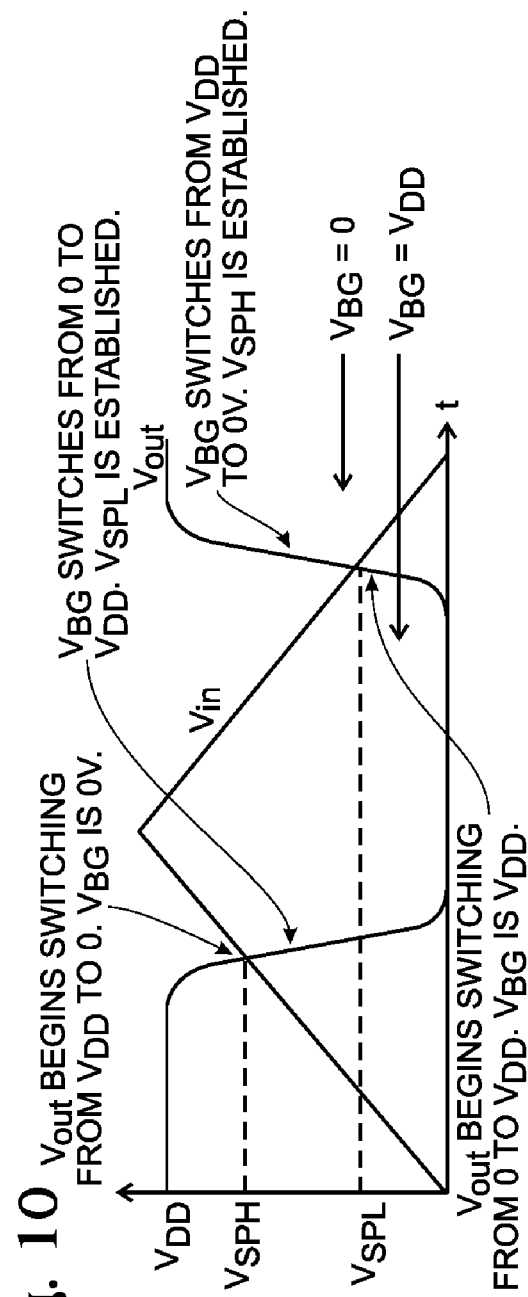
FIG. 10 is a diagram depicting the operation of the present invention Schmitt trigger inverter.

FIG. 10 is a diagram depicting the operation of the present invention Schmitt trigger inverter. For simplicity, it is assumed that the feedback inverter's (M3 and M4) switching point is at $V_{DD}/2$. Considering a rising input signal, the inverter switches output state (from $V_{DD}$ to 0V), when $V_{in}$ exceeds $V_{SPH}$. At this moment, the output of the feedback inverter (M3 and M4) supplying the back gate bias also switches states, from 0V to $V_{DD}$. This results in the threshold of the NMOS DG-TFT becoming less positive and the threshold voltage of the PMOS DG-TFT becoming more negative. In other words, the NMOS, which is already turned ON, turns ON harder. The opposite condition is true for the PMOS.

The situation is reversed with a falling input signal, from $V_{DD}$ to 0V. In this case, $V_{out}$ is initially at 0V, and the feedback inverter applies a back gate bias equal to $V_{DD}$ to both DG-TFTs. The switching point of the inverter is still derived using formula 1, above. However, due to the lower NMOS threshold voltage and higher PMOS threshold voltage, $V_{SP}=V_{SPL}<V_{DD}/2$. For example, $V_{SP}$ can be set at $\frac{1}{3}V_{DD}$. For this value of switching voltage, according to (1) and (2), the M1 and M2 threshold voltages with a high bottom gate bias should satisfy:

$$\sqrt{\frac{\mu_n W_{M2}}{\mu_p W_{M1}}}\, V_{TN} - V_{TP} = \frac{V_{DD}}{3}\left(\sqrt{\frac{\mu_n W_{M2}}{\mu_p W_{M1}}} - 2\right) \quad (4)$$

Since $W_{M1}$ and $W_{M2}$ have been set according to (3), the threshold voltages under bottom gate bias ($V_{TN}$ and $V_{TP}$) are engineered to satisfy (4) through appropriate selection of bottom gate dielectric thickness (see FIG. 8).

The inverter switches states when $V_{in}<V_{SPL}$. At this point in time, the change in output state causes the feedback inverter to also switch states (from $V_{DD}$ to 0V). The NMOS DG-TFT, which was already in the process of turning OFF, is turned OFF even harder, and the PMOS is turned ON harder.

The present invention design serves a very specialized operation, finding application as an interface for analog/digital ports, and as a building block for certain combinational logic digital circuits. The invention is not merely an extension of conventional dual-gate transistor structures, since there is no history of using dual-gate devices for operations, or in the device combination of circuit described herein.

In order to perform the desired operation, a precise optimization process is required for determining the present invention dual-gate transistor geometry (e.g., channel length and channel width) and characteristics (e.g., carrier mobility and threshold voltage), as well as the levels for the secondary gate bias Vb. An example of this approach is presented below. That is, two conventional dual-gate transistors cannot simply be connected to make a Schmitt trigger inverter. Rather, a specific version of a DG-TFT is necessary to enable the present invention.

For example, in order to optimize the operation of the circuit, the value of the secondary gate bias Vb for normal inverter operation is first selected. This value can be equal to zero if the dual-gate transistors have optimized threshold voltages, so that the switching point of the inverter (the input voltage bias at which the current through the two transistors is maximized) is at half the supply voltage. This level of switching voltage is desired for a number of reasons, such as optimized switching speed and minimum power consumption. Alternately, if the fabricated DG-TFTs do not exhibit a well-balanced switching voltage because of other design tradeoffs, the value of Vb for normal inverter operation can be engineered to compensate.

In order to achieve the minimum propagation delay in normal inverter operation, it is necessary to minimize parasitic effects such as parasitic coupling between the secondary gate and the transistors active region. For example, the coupling may be minimized between region 506, and regions 510 and 508 of the NMOS device. Likewise, the coupling can be minimized between region 516, and regions 518 and 520 of the PMOS device, see FIG. 5. This result can be achieved by using a shorter bottom gate that does not overlap (horizontally extend past) the top gate electrode.

In this manner, the transient characteristics of the circuit are enhanced if necessary, without a penalty in operation. A shorter bottom gate limits the influence of the bottom gate on the device threshold voltage: only negative (positive) threshold voltage shifts are possible in an NMOS (PMOS) device. This is not a problem though, since for a high-impedance output, the device thresholds are switched in this direction by Vb. The magnitude of Vb for high impedance operation is engineered in conjunction with the bottom gate dielectric thickness, to produce the desired threshold voltage shift.

In general, the design process involves the determination of the M1 and M2 transistor widths $W_{M1}$ and $W_{M2}$ in order to satisfy the first switching point, and the determination of a bottom gate dielectric thickness that sets the threshold voltages of M1 and M2 under high bottom gate bias to the levels which produce the second switching point.

FIG. 11 is a flowchart illustrating a method for forming a four-transistor Schmitt trigger inverter. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1100.

Step 1102 forms a two-transistor variable threshold level inverter including an NMOS dual-gate thin-film transistor (DG-TFT) with a top gate, a back gate, and source/drain (S/D) regions. Step 1102 also forms a PMOS DG-TFT with a top gate, a back gate, and S/D regions. Step 1104 forms a NMOS TFT. Step 1106 forms a PMOS TFT. Step 1108 connects an NMOS TFT gate to an NMOS DG-TFT first S/D region, a PMOS DG-TFT first S/D region, and a PMOS TFT gate. Step 1110 connects an NMOS TFT first S/D region to the NMOS DG-TFT back gate, the PMOS DG-TFT back gate, and a PMOS TFT first S/D region.

Step 1112 forms an input signal (Vin) interconnect to the NMOS DG-TFT top gate and the PMOS DG-TFT top gate. Step 1114 forms an output signal (Vout) interconnect to the NMOS DG-TFT first S/D region. Step 1116 connects a NMOS TFT second S/D region to a reference voltage. Step 1118 connects a PMOS TFT second S/D region to a supply voltage, where the reference voltage is lower in voltage than the supply voltage. Step 1120 connects an NMOS DG-TFT second S/D region to the reference voltage. Step 1122 connects a PMOS DG-TFT second S/D region to the supply voltage.

In one aspect, forming an NMOS DG-TFT with the top gate, back gate, and S/D regions in Step 1102 includes substeps. Step 1102a forms an active Si layer interposed between the top gate and the bottom gate. Step 1102b crystallizes the active Si layer, and Step 1102c forms top gate channel and S/D regions in the active Si layer.

In another aspect, crystallizing the active Si layer in Step 1102b includes substeps (not shown). Step 1102b1 irradiates portions of the active Si layer in a stepping sequence, with a first laser beam having a wavelength in the range of about 200 nanometers (nm) to about 600 nm. Step 1102b2 melts the active Si layer. Step 1102b3 transforms the active Si layer to polycrystalline Si. Although the crystallization of an NMOS DG-TFT has been described, equivalent processes may also be performed on the PMOS DG-TFT.

In a different aspect, Step 1102 may form the NMOS and PMOS DG-TFTs on a substrate top surface, where the substrate is a materials such as glass, plastic, or quartz. These substrates are known to be sensitive to process temperatures exceeding about 600° C. Then, crystallizing the active Si layer in Step 1102b includes additional substeps (not shown). Step 1102b4 irradiates a substrate bottom surface with a second laser beam. For example, the substrate bottom surface can be irradiated with a second laser beam having a wavelength in the range of about 9 to 11 micrometers ($\mu$m). In another aspect, the substrate bottom surface is irradiated with a $CO_2$-gas laser. Step 1102b5 heats the substrate with the second laser beam simultaneously with the melting of the active Si layer with the first laser beam (Step 1102b2).

In one aspect, forming the NMOS and PMOS DG-TFTs in Step 1102 includes forming DG-TFTs with channels having channel widths underlying the top gates, and forming DG-TFTs with dielectric thicknesses between the channels and the bottom gates. Then, Step 1124 sets a circuit first switch point in response to the DG-TFT channel widths. Step 1126 sets a circuit second switch point, lower than the first switch point, in response to the dielectric thicknesses between the channels and the bottom gates.

FIG. 12 is a flowchart illustrating a method for introducing hysteresis into the operation of a CMOS inverter. The method starts at Step 1200. Step 1202 provides a circuit consisting of an NMOS TFT series-connected to a PMOS TFT, interposed between a supply voltage and reference voltage. Step 1204 creates a first switch point for the NMOS and PMOS TFTs, higher in voltage than the reference voltage but lower than the supply voltage, in response to a high logic output. Step 1206 creates a second switch point for the NMOS and PMOS TFT, higher in voltage than the reference voltage but lower than the first switch voltage, in response to a low logic output.

Step 1208 accepts an input signal (Vin) at a Schmitt trigger inverter input. Step 1210 generates an high logic output (Vout) in response to a low logic input, as referenced to the second switch point. Step 1212 generates a low logic output in response to a high logic input, as referenced to the first switch point.

In one aspect, creating the first switch point in Step 1204 includes substeps. Step 1204a increases the absolute value of the N MOS TFT threshold voltage (causing the device to turn ON with a lower input voltage). Step 1204b increases the absolute value of the PMOS TFT threshold voltage (causing the device to turn OFF with a lower input voltage). Likewise, creating the second switch point in Step 1206 includes substeps. Step 1206a decreases the absolute value of NMOS TFT threshold voltage, and Step 1206b decreases the absolute value of the PMOS TFT threshold voltage.

In one aspect, providing the N MOS TFT series-connected to the PMOS TFT in Step 1202 includes providing a NMOS DG-TFT having a top gate connected to the inverter input, a back gate, and source/drain regions. Step 1202 also provides a PMOS DG-TFT having a top gate connected to the inverter input, a back gate, and S/D regions. Step 1202 provides an NMOS TFT having a gate connected to an NMOS DG-TFT first S/D region and a PMOS DG-TFT first S/D region to supply the output. The NMOS TFT has a first S/D region connected to the NMOS DG-TFT back gate and the PMOS DG-TFT back gate to supply a control voltage. Further, Step 1202 provides a PMOS TFT having a gate connected to the NMOS TFT gate, and a first S/D region connected to the NMOS TFT first S/D region.

Then, Step 1204a increases the absolute value of the NMOS DG-TFT threshold voltage in response accepting the control voltage at the NMOS DG-TFT back gate. Step 1204b increases the absolute value of the PMOS DG-TFT threshold voltage in response to accepting the control voltage at the PMOS DG-TFT back gate. Likewise, Step 1206a decreases the absolute value of the NMOS DG-TFT threshold voltage in response accepting the control voltage at the NMOS DG-TFT back gate. Step 1206b decreases the absolute value of the PMOS DG-TFT threshold voltage in response to accepting the control voltage at the PMOS DG-TFT back gate.

In a different aspect, generating the first switch point in Step 1204 includes accepting a control voltage at the NMOS and PMOS DG-TFT back gates, lower than the high logic output, and higher than a mid-voltage point, which is about half the difference between the supply and reference voltages. Likewise, generating the second switch point in Step 1206 includes accepting a control voltage at the NMOS and PMOS DG-TFT back gates, higher than the low logic output, and lower than the mid-voltage point. In other aspects, the DG-TFT fabrication processes can be modified to vary the above-mentioned switch point voltage levels, and relationship between switch points.

In one aspect, providing the NMOS and PMOS DG-TFTs in Step 1202 includes providing DG-TFTs having channels with channel widths underlying the top gates, and dielectric thicknesses between the channels and the bottom gates. Generating the first switch point in Step 1204 includes generating the first switch point in response to the DG-TFT channel widths, and generating the second switch point in Step 1206 includes generating the second switch point in response to the dielectric thicknesses between the channels and the bottom gates.

A four-transistor Schmitt trigger inverter has been presented, along with some associated fabrication details and methods of use. Examples of particular voltages have been used to illustrate the invention. However, the invention is not limited to merely these examples. Other variations and embodiments of the invention will occur to those skilled in the art.

We claim:

1. A four-transistor Schmitt trigger inverter, the Schmitt trigger inverter comprising:
    a NMOS dual-gate thin-film transistor (DG-TFT) having a top gate, a back gate, and source/drain regions;
    a PMOS DG-TFT having a top gate, a back gate, and S/D regions;
    an NMOS TFT having a gate connected to an NMOS DG-TFT first S/D region and a PMOS DG-TFT first S/D region, and a first S/D region connected to the NMOS DG-TFT back gate and the PMOS DG-TFT back gate; and,
    a PMOS TFT having a gate connected to the NMOS TFT gate, and a first S/D region connected to the NMOS TFT first S/D region; wherein the DG-TFTs have channels with channel widths underlying the top gates, and dielectric thickness between the channels and the bottom gates; and wherein the Schmitt trigger inverter further comprises a circuit first switch point responsive to the DG-TFT channel widths, and a circuit second switch point, lower than the first switch point, responsive to the dielectric thickness between the channels and the bottom gates.

2. The Schmitt trigger inverter of claim 1 wherein the NMOS DG-TFT top gate is connected to an input signal (Vin) and the first S/D region supplies an output signal (Vout);
    wherein the PMOS DG-TFT top gate is connected to the input signal;
    wherein the NMOS DG-TFT has a second S/D region is connected to a reference voltage;
    wherein the PMOS DG-TFT has a second S/D region connected to a supply voltage having a higher voltage than the reference voltage; wherein an NMOS TFT second S/D region is connected to the reference voltage; and,
    wherein a PMOS TFT second S/D region is connected to the supply voltage.

3. The Schmitt trigger inverter of claim 1 wherein the NMOS DG-TFT includes:
    a crystallized Si active layer interposed between the top gate and the back gate;
    top gate channel and S/D regions formed in the crystallized Si active layer.

4. The Schmitt trigger inverter of claim 3 wherein the crystallized Si active layer is formed in a single-crystal-like structure having grain boundaries in a first direction, parallel to a flow of carriers between the S/D regions in a second direction.

* * * * *